US008007895B2

(12) United States Patent
Ebina et al.

(10) Patent No.: US 8,007,895 B2
(45) Date of Patent: Aug. 30, 2011

(54) TRANSPARENT FILM

(75) Inventors: Takeo Ebina, Miyagi (JP); Fujio Mizukami, Miyagi (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 109 days.

(21) Appl. No.: 11/997,355

(22) PCT Filed: Aug. 2, 2006

(86) PCT No.: PCT/JP2006/315338
§ 371 (c)(1),
(2), (4) Date: Mar. 11, 2008

(87) PCT Pub. No.: WO2007/015534
PCT Pub. Date: Feb. 8, 2007

(65) Prior Publication Data
US 2010/0104805 A1   Apr. 29, 2010

(30) Foreign Application Priority Data
Aug. 3, 2005   (JP) .................... 2005-226026

(51) Int. Cl.
*B32B 3/00* (2006.01)
*B32B 9/04* (2006.01)
*B32B 27/40* (2006.01)
*B32B 27/38* (2006.01)
(52) U.S. Cl. .............. 428/141; 428/411.1; 428/446; 428/702; 428/423.1; 428/413
(58) Field of Classification Search .......... 428/141, 428/411.1, 446, 702, 423.1, 413, 522, 474.4, 428/480, 473.5, 523, 412, 500, 220
See application file for complete search history.

(56) References Cited

U.S. PATENT DOCUMENTS
7,160,942 B2   1/2007   Chaiko
2007/0027248 A1*  2/2007   Ebina et al. ............... 524/445
(Continued)

FOREIGN PATENT DOCUMENTS
JP   52-15807   2/1977
(Continued)

OTHER PUBLICATIONS
Machine English Translation of Ebina JP_2005/200290_A, "Nylon Composite Clay Film and Its Producing Method", Jul. 28, 2005, JPO, pp. 1-19.*
(Continued)

*Primary Examiner* — David R Sample
*Assistant Examiner* — Tahseen Khan
(74) *Attorney, Agent, or Firm* — Oblon, Spivak, McClelland, Maier & Neustadt, L.L.P.

(57) ABSTRACT

The present invention provides a novel technology and a novel transparent material having high thermal stability, excellent pliability, surface smoothness, dimensional stability and gas barrier properties, for the technical fields of packaging materials, sealing materials and display materials, and the invention relates to an inorganic layered compound film having oriented inorganic layered compound particles, exhibiting high surface smoothness, high dimensional stability, high transparency, excellent pliability, excellent gas barrier properties and high heat resistance, that is obtained by dispersing an inorganic layered compound of high transparency and a small amount of water-soluble polymer of high transparency in water or a liquid having water as a main component thereof, to thereby obtain a homogenous dispersion containing no agglomerates, applying thereafter this dispersion onto a support having a flat and water-layered compound particles, and separating the liquid, as a dispersion medium, according to any of various solid-liquid separation methods, for example, centrifugation, filtration, vacuum drying, vacuum freeze drying, evaporation by heating or the like to thereby attain formation into a film shape, and optionally followed by methods such as drying/heating/cooling to thereby effect detachment from the support.

10 Claims, 2 Drawing Sheets

FOREIGN PATENT DOCUMENTS

| | | |
|---|---|---|
| JP | 61-3767 | 2/1986 |
| JP | 63-64913 | 3/1988 |
| JP | 5-254824 | 10/1993 |
| JP | 6-95290 | 4/1994 |
| JP | 7-17371 | 3/1995 |
| JP | 7-251489 | 10/1995 |
| JP | 10-231434 | 9/1998 |
| JP | 2002-30255 | 1/2002 |
| JP | 2005-200290 | 7/2005 |
| JP | 2005200290 A * | 7/2005 |
| WO | WO 2005/023714 A1 | 3/2005 |
| WO | WO 2005023714 A1 * | 3/2005 |
| WO | WO 2006/062209 A1 | 6/2006 |

OTHER PUBLICATIONS

Haruo Shiramizu, "Clay Mineralogy (Nendo Kobutsu Gaku)-Basics of Clay Science", Asakura Shoten, 1988, Two front pages and pp. 57-58.

Yasushi Umemura, et al., "Preparation of Methylene Blue-Clay Hybrid Films by a Modified Langmuir-Blodgett Method and Molecular Orientation of Methylene Blue in the Film", vol. 42, No. 4, 2003, pp. 218-222 (English abstract).

Kostas S. Triantafyllidis, et al., "Epoxy-Clay fabric Film Composites with Unprecedented Oxygen-Barrier Properties", Chem. Mater., 18, 2006, 4393-4398.

David J. Chaiko, "New Poly(ethylene oxide)-Clay Composites", Chem. Mater., 15, 2003, pp. 1105-1110.

Takeo Ebina, "Development of heat-resist gas barrier films Claist", Material Stage, vol. 4, No. 11, 2005, one front page and pp. 64-67.

U.S. Appl. No. 11/721,403, filed Jun. 11, 2007, Ebina et al.

Takeo Ebina, "Development of heat-resist gas barrier films Claist", Material Stage, vol. 4, No. 11, 2005, one front page and pp. 64-67 (submitting English translation only, reference previously on Feb. 22, 2008).

* cited by examiner

1

TRANSPARENT FILM

CROSS-REFERENCE TO RELATED APPLICATIONS

This application is a 371 of PCT/JP2006/315338 filed Aug. 2, 2006 and claims the benefit of JP 2005-226026 filed Aug. 3, 2005.

TECHNICAL FIELD

The present invention relates to a transparent material comprising a film having an inorganic layered compound as main constituent thereof, and more particularly to a transparent material which has mechanical strength so as to allow it to be used as a self-supporting film, and has heat resistance and gas barrier properties, and in which a laminate of inorganic layered compound particles is highly oriented. In the technical fields of packaging materials, sealing materials and display materials there exists an ongoing urge for the development of transparent and pliable materials having high gas barrier properties, and having such thermal resistance that enables use at high temperatures. In response to this situation, the present invention provides a novel technology and a novel transparent material having high thermal stability and also excellent pliability and gas barrier properties.

BACKGROUND ART

Liquid crystal devices, organic EL devices and the like have been developed as energy-saving devices that have supersedes CRTs. The next goal herein is achieving a flexible display overall, in applications such as electronic paper and the like, to which end there are required pliable, heat-resistant films. However, although conventional materials, for instance plastic films, are pliable, their heat resistance and gas barrier properties are arguably insufficient, while thin-sheet glass, which has excellent light transmittance and heat resistance, is problematic in being insufficiently pliable. Moreover, thin-sheet glass can be manufactured only down to a thickness of about 0.4 mm, which adds to the pliability problem the difficulty of achieving lighter weights. There is an urge thus for the development of a film-like material that combines pliability, heat resistance, transparency and gas barrier properties. In terms of realizing pliability and light weight, the film should be as thin as possible, while the film substrate should have surface smoothness, resistance to chemicals, as well as dimensional stability or low dilatability.

An inorganic layered compound such as swelling clay or the like is known to form a film having evenly oriented particles by dispersing the inorganic layered compound in water or alcohol, spreading the dispersion onto a glass sheet, and letting it stand to dry. For example, oriented specimens for X-ray diffraction have been prepared using this method (See Non-patent Document 1). However, when a film was formed on a glass sheet, it was difficult to strip the inorganic layered compound thin film off the glass sheet, while cracks formed in the thin film during strip-off, among other problems that made it difficult to obtain a self-supporting film. Even if the film was stripped successfully off the glass sheet, the resulting film was brittle and lacked sufficient strength. To date, it has been difficult to manufacture an even-thickness film free of pinholes and having excellent gas barrier properties.

Meanwhile, various polymeric resins are used as molding materials, and also as dispersants, thickeners, binders, and as gas barrier materials having inorganic materials blended therein. For instance, a known film having gas barrier properties may be obtained by manufacturing a film having a thickness of 0.1 to 50 μm from a composition comprising 100 parts by weight of a mixture of (A) a highly hydrogen-bondable resin containing two or more carboxyl groups per molecule, such as polyacrylic acid or the like, and (B) a highly hydrogen-bondable resin containing two or more hydroxyl groups in its molecular chain, for instance starch or the like, to a weight ratio A/B=80/20 to 60/40, and 1 to 10 parts by weight of an inorganic layered compound such as a clay mineral or the like; and by subjecting then the film to a thermal treatment and an electron beam treatment (See Patent Document 1). The above film is problematic, however, in that the main component thereof is a water-soluble polymer resin, so heat resistance is not very high.

Also, a laminated film having excellent moisture resistance and gas barrier properties, suitable for food packaging, can be obtained by laminating a layer composed of a resin composition comprising a resin and an inorganic layered compound between two polyolefin-based resin layers (See Patent Document 2). In this case, however, the layer of resin composition comprising an inorganic layered compound is merely used as part of a multilayer film, and not on its own as a self-supporting film. Also, the heat resistance of such laminated films is governed by the organic material having the lowest heat resistance in the composition, in this case a polyolefin, which is a material that does not afford high heat resistance.

Recently, there have been manufactured inorganic layered compound thin films using the Langmuir-Blodgett method (See Non-patent Document 2). This method, however, involves forming an inorganic layered compound thin film on a substrate surface finished with a material such as glass or the like, and precludes achieving an inorganic layered compound thin film strong enough for a self-supporting film. Various other methods have also been reported for preparing functional inorganic layered compound thin films and the like. For instance, there is disclosed a method for manufacturing a clay thin film in which an aqueous dispersion of a hydrotalcite-based interlayer compound is made into a thin film and dried (See Patent Document 3); a method for manufacturing a clay mineral thin film in which the bond structure of a clay mineral is oriented and fixed through a thermal treatment that promotes a reaction between the clay mineral and phosphoric acid or phosphoric acid groups (See Patent Document 4); and an aqueous composition for a coating treatment, containing a complex compound of a divalent or higher metal and a smectite-based clay mineral (See Patent Document 5), to cite just a few of the many such examples. However, none of the above methods affords an inorganic layered compound oriented self-supporting film having enough mechanical strength to be used as a self-supporting film, and being imparted with gas barrier properties due to highly oriented clay particle layers.

In the cosmetic and pharmaceuticals fields, meanwhile, there have been proposed composites of inorganic layered compounds and organic compounds, for instance advantageous organic composite clay minerals (for instance, see Patent Documents 6 and 7), or in the manufacture of a drug for treating wet athlete's foot, comprising a mixture of a clay mineral, an acid, and an enzyme (for instance, see Patent Documents 8 and 9). Nevertheless, the fact remains that these organic composite clay minerals have failed thus far to be used as self-supporting films. There is thus an urgent need in this technical field for the development and practical application of a novel inorganic layered compound film having enough mechanical strength to be used as a self-supporting film.

Patent Document 1: Japanese Patent Application Laid-Open No. H10-231434
Patent Document 2: Japanese Patent Application Laid-Open No. H07-251489
Patent Document 3: Japanese Patent Application Laid-Open No. H06-95290
Patent Document 4: Japanese Patent Application Laid-Open No. H05-254824
Patent Document 5: Japanese Patent Application Laid-Open No. 2002-30255
Patent Document 6: Japanese Patent Application Laid-Open No. S63-64913
Patent Document 7: Japanese Patent Application Publication No. H07-17371
Patent Document 8: Japanese Patent Application Laid-Open No. S52-15807
Patent Document 9: Japanese Patent Application Laid-Open No. S61-3767
Non-patent Document 1: Haruo Shiramizu, "Clay Mineralogy (Nendo Kobutsu Gaku)—Basics of Clay Science", Asakura Shoten, p. 57 (1988)
Non-patent Document 2: Yasufumi Umemura, Nendo Kagaku (Clay Science), Vol. 42, No. 4, 218-222 (2003)

DISCLOSURE OF THE INVENTION

Under such circumstances and in light of the above conventional technology, the inventors carried out diligent research directed at developing a novel transparent gas barrier film excellent in flexibility, having mechanical strength so as to allow it to be used as a self-supporting film, and capable of being used under high-temperature conditions, exceeding 200° C. As a result of such research, the inventors found out that an inorganic layered compound film having oriented inorganic layered compound particles, and exhibiting high transparency, excellent pliability, excellent gas barrier properties and high heat resistance, is obtained by dispersing an inorganic layered compound of high transparency and a small amount of a water-soluble polymer of high transparency in water or a liquid having water as a main component thereof, to thereby obtain a homogeneous dispersion containing no agglomerates, applying thereafter this dispersion onto a support having a flat and water-repellent surface, to thereby effect deposition of inorganic layered compound particles, and separating the liquid, as a dispersion medium, according to any of various solid-liquid separation methods, for example, centrifugation, filtration, vacuum drying, vacuum freeze drying, evaporation by heating or the like to thereby attain formation into a film shape, and optionally followed by methods such as drying/heating/cooling to thereby effect detachment from the support. As a result of further research, the inventors perfected the present invention by finding out, for instance, a preferred inorganic layered compound, as well as a suitable water-soluble polymer for the inorganic layered compound, an optimal mixing ratio of the inorganic layered compound and the water-soluble polymer, an optimal solid-liquid ratio for a dispersion, preferred support materials, preferred dispersion methods and the like, all of which succeeded in enhancing the pliability, transparency and heat resistance of the film. An object of the present invention is to provide a flexible transparent material having mechanical strength so as to allow it to be used as a self-supporting film, having light transmittance and having excellent flexibility, by effecting compact and highly oriented layering of an inorganic layered compound.

In order to solve the above problems, the present invention comprises the following technical means.

(1) A transparent material as a film having a layered inorganic compound as a main constituent thereof: comprising 1) a layered inorganic compound and a water-soluble resin; 2) the weight ratio of the layered inorganic compound being not less than 70% relative to total solids; the film has 3) a total light transmissivity exceeding 80%; 4) gas barrier properties; and 5) mechanical strength so as to allow it to be used as a self-supporting film.

(2) The transparent material according to (1) above, wherein the inorganic layered compound is layered silicic acid, or layered titanic acid, or a salt thereof.

(3) The transparent material according to (1) above, wherein the layered inorganic compound is one or more selected from among mica, vermiculite, montmorillonite, beidellite, saponite, hectorite, stevensite, magadiite, ilerite, kanemite and layered titanic acid.

(4) The transparent material according to (1) above, wherein the water-soluble resin is one or more selected from among epsilon caprolactam, dextrin, starch, cellulose resins, gelatin, agar, wheat flour, gluten, chitin, chitosan, polylactic acid, alkyd resins, polyurethane resins, epoxy resins, fluororesins, acrylic resins, methacrylic resins, phenolic resins, polyamide resins, polyester resins, polyimide resins, polyvinyl resins, polycarbonate, polyethylene glycol, polyacrylamide, polyethylene oxide, proteins, deoxyribonucleic acid, ribonucleic acid, polyamino acids, benzoic acid compounds, and acrylic acid resins.

(5) The transparent material according to (1) above, wherein light transmittance, gas barrier properties or mechanical strength are improved by forming new chemical bonds within molecules of an additive, between molecules of the additive, between the additive and the inorganic layered compound and between inorganic layered compound crystals, through a chemical reaction such as an addition reaction, a condensation reaction or a polymerization reaction, using any method such as heating or light irradiation.

(6) The transparent material according to (1) above, wherein a thickness of the film is not greater than 0.2 mm.

(7) The transparent material according to (1) above, wherein a light transmissivity of the film at 500 nm is not less than 80%, as measured by an ultraviolet-visible spectroscope.

(8) The transparent material according to (1) above, wherein a light transmissivity of the film at 500 nm is not less than 75%, as measured by an ultraviolet-visible spectroscope, after heating at 200° C. for 1 hour under normal air conditions.

(9) The transparent material according to any one of (1) to (8) above, wherein in a differential thermal analysis, weight reduction of the film in a temperature range from 200° C. to 450° C. is less than 20% on a dry solids basis, and there is no change in the basic structure of the layered inorganic compound constituting the transparent material.

(10) The transparent material according to any one of (1) to (9) above, wherein a permeability coefficient of the film to oxygen gas is less than $3.2 \times 10^{-11}$ $cm^2$ $s^{-1}$ cm $Hg^{-1}$ at room temperature.

(11) The transparent material according to any one of (1) to (9) above, wherein a permeability coefficient of the film to oxygen gas is less than $3.2 \times 10^{-11}$ $cm^2$ $s^{-1}$ cm $Hg^{-1}$ at room temperature after a thermal treatment at 300° C. for 1 hour.

(12) The transparent material according to any one of (1) to (11) above, wherein the film can be used without cracking or the like even at a bending radius of 6 mm.

(13) The transparent material according to any one of (1) to (12) above, wherein an average surface roughness of the film is not greater than 20 nm, as measured by an atomic force microscope.

(14) The transparent material according to any one of (1) to (13) above, wherein a linear thermal expansion coefficient of the film is −10 to 10 ppm at from −100° C. to +200° C.

(15) The transparent material according to any one of (1) to (14) above, wherein the transparent material is a sealing material, a packaging material, a protective material, a flexible substrate or a display material.

The present invention is explained in detail next.

The inventors found out that an inorganic layered compound film having oriented inorganic layered compound particles, and exhibiting high transparency, excellent pliability, excellent gas barrier properties and high heat resistance, is obtained by dispersing an inorganic layered compound of high transparency and a small amount of a water-soluble polymer of high transparency in water or a liquid having water as a main component thereof, to thereby obtain a homogeneous dispersion containing no agglomerates, applying thereafter this dispersion onto a support having a flat and water-repellent surface, to thereby effect deposition of inorganic layered compound particles, and separating the liquid, as a dispersion medium, according to any of various solid-liquid separation methods, for example, centrifugation, filtration, vacuum drying, vacuum freeze drying, evaporation by heating or the like to thereby attain film formation into a film shape, and optionally followed by methods such as drying/heating/cooling to thereby effect detachment from the support. As a result of further research, the inventors perfected the present invention by finding out, for instance, a preferred inorganic layered compound, as well as a suitable water-soluble polymer for the inorganic layered compound, an optimal mixing ratio of the inorganic layered compound and the water-soluble polymer, an optimal solid-liquid ratio for a dispersion, preferred support materials, preferred dispersion methods and the like, all of which succeeded in enhancing the pliability, transparency and heat resistance of the film. That is, the present invention affords a flexible transparent material, as a self-supporting film, having light transmittance and having excellent thermal stability and gas barrier properties, by using a layered inorganic compound of high transparency and a small amount of a water-soluble polymer of high transparency, by molding to a flat surface, and by employing such manufacturing conditions that allow reducing to minimum internal cracks or inhomogeneities caused by agglomerates, by effecting compact and oriented layering of the inorganic layered compound, thus imparting the transparent material with mechanical strength so as to allow it to be used as a self-supporting film having a homogeneous thickness. In contrast to linear expansion coefficients of about 50-70 ppm $K^{-1}$ in ordinary transparent resins, the film of the present invention has an extremely small linear expansion coefficient, thanks to having clay as a main component thereof.

Examples of the inorganic layered compound used in the present invention include natural or synthetic compounds, suitably, for instance, one or more among mica, vermiculite, montmorillonite, beidellite, saponite, hectorite, stevensite, magadiite, ilerite, kanemite and flake-like titanium, more suitably, any of the foregoing compounds or mixtures thereof. The water-soluble polymer used in the present invention is not particularly limited, provided it has polar groups in the main chain or side chains, being hence hydrophilic, or being a cationic, anionic or nonionic polymer having high solubility in water. Suitable examples of such a water-soluble polymer include, for instance, one or more types among epsilon caprolactam, dextrin, starch, cellulose resins, gelatin, agar, wheat flour, gluten, chitin, chitosan, polylactic acid, alkyd resins, polyurethane resins, epoxy resins, fluororesins, acrylic resins, methacrylic resins, phenolic resins, polyamide resins, polyester resins, polyimide resins, polyvinyl resins, polycarbonate, polyethylene glycol, polyacrylamide, polyethylene oxide, proteins, deoxyribonucleic acid, ribonucleic acid, polyamino acids, benzoic acid compounds, acrylic acid resins and the like. The inorganic layered compound used in the present invention is also hydrophilic and dissolves readily in water. Such a water-soluble polymer and the inorganic layered compound are mutually compatible, and bond easily to form a composite when both are mixed in water.

In the method for manufacturing a transparent material of the present invention, first there must be prepared a homogenous dispersion by adding the inorganic layered compound and the water-soluble polymer to a liquid that is a dispersion medium of water or having water as a main component thereof. The method for preparing such a dispersion may be a method involving adding the water-soluble polymer after dispersion of the inorganic layered compound, dispersing the inorganic layered compound in a solution comprising the water-soluble polymer, or adding simultaneously the inorganic layered compound and the water-soluble polymer to the above dispersion medium to yield a dispersion. In terms of ease of dispersion, the inorganic layered compound is preferably dispersed in a liquid that is a dispersion medium of water or having water as a main component thereof, followed by addition of the water-soluble polymer. In this case, firstly the inorganic layered compound is added to the liquid being a dispersion medium of water or having water as a main component thereof, to prepare a dilute homogeneous inorganic layered compound dispersion. The concentration of the inorganic layered compound in the inorganic layered compound dispersion ranges preferably from 0.3 to 10 wt %, more preferably from 0.5 to 1 wt %. If the inorganic layered compound concentration is too low, drying may take an excessive time, which is problematic. If the inorganic layered compound concentration is excessive, the inorganic layered compound fails to disperse well, thereby impairing the orientation of the inorganic layered compound particles, and precluding achieving a homogeneous film, which is problematic. If the inorganic layered compound concentration is excessive, moreover, there may occur problems such as cracks and surface roughness due to contraction during drying, as well as uneven film thickness or the like.

Next, the water-soluble polymer or a solution containing the same is weighed and is added to the above inorganic layered compound dispersion, to prepare a homogeneous dispersion comprising the inorganic layered compound and the water-soluble polymer. As described above, both the inorganic layered compound and the water-soluble polymer are hydrophilic, and disperse readily in water. Also, the water-soluble polymer and the inorganic layered compound are mutually compatible, and hence bond easily to form a composite when both are mixed in water. The weight proportion of water-soluble polymer relative to total solids is less than 30%, preferably of 5% to 20%. If the proportion of water-soluble polymer is too low, the effect of the latter fails to be brought out during use, while when the proportion of water-soluble polymer is too high, the heat resistance of the obtained film becomes impaired. The dispersion method is not particularly limited provided that it enables as vigorous a dispersion as possible. Preferred herein is a method using an agitation apparatus equipped with a stirring blade, a vibrating agitation apparatus, a homomixer or the like, in particular a method using a homomixer on the last dispersion stage, with a view to eliminating small agglomerates. When agglomerates are present in the dispersion they may give rise to film surface roughness or film texture unevenness, and may cause surface scattering or internal scattering of light.

Next, the dispersion comprising the inorganic layered compound and the water-soluble polymer is deaerated. The deaeration method includes vacuum evacuation, heating, centrifuging or the like, but is preferably a method comprising vacuum evacuation. Removing small air pockets by centrifugation or the like after deaeration is effective in enhancing film transparency. Centrifugation conditions may involve, for instance, 5500 rpm over 20 minutes. The deaerated dispersion is coated on a support surface to a constant thickness. Next, the dispersion medium liquid is evaporated slowly, to yield a film shape. The method for drying the composite inorganic layered compound film thus formed may involve, for instance, any method among centrifugation, filtration, vacuum drying, vacuum freeze drying and evaporation by heating, or a combination thereof. When for instance evaporation by heating is employed among the above methods, the dispersion previously deaerated by vacuum evacuation is applied onto a support such as a flat tray, preferably a tray finished with a water-repellent support such as polypropylene, Teflon™ or the like. The support is then placed, while kept horizontal, in a forced draft oven, where it is dried under temperature conditions of 30 to 90° C., preferably of 30 to 50° C., for about 10 minutes to 3 hours, preferably for about 20 minutes to 1 hour, to yield a water-soluble polymer-composite inorganic layered compound film. Other than a water-repellent material such as polypropylene, Teflon™ or the like, there may be preferably used, in the support surface, a material having been subjected to a water-repellency treatment such as titania coating or the like. If the support surface is not water-repellent, the film becomes adhered to the support, being detached therefrom only with difficulty, which is problematic. Preferably, the support surface is as flat as possible. If the support surface is not flat, the support surface irregularities are transferred to the film surface, where they give rise to surface scattering of light.

If the dispersion comprising the inorganic layered compound and the water-soluble polymer is not deaerated beforehand, the obtained composite inorganic layered compound film is likely to exhibit holes resulting from air bubbles, which may be problematic. Air bubbles trapped in the composite inorganic layered compound film are problematic as they give rise to internal scattering of light, which results in film clouding. The drying conditions are set in such a way that the liquid component is sufficiently removed through evaporation. Too low a temperature is problematic herein in that drying requires more time. An excessively high temperature is also problematic in that it causes dispersion convection, as a result of which the thickness of the film becomes uneven, while reducing the degree of orientation of the inorganic layered compound particles. Adjusting the amount of solids used in the dispersion allows obtaining an arbitrary thickness of the water-soluble polymer-composite inorganic layered compound film of the present invention. As regards thickness, forming a thinner film tends not to give rise to surface roughness, thus affording excellent light transmissivity. On the other hand, a thicker film reduces pliability, which is problematic. Preferably, thus, the thickness is not greater than 0.2 mm.

In the present invention, imparting high orientation to a laminate of inorganic layered compound particles refers to layering unit constituent layers (having each a thickness of about 1 nm) of the inorganic layered compound particles to a same layer surface orientation, thus imparting high periodicity in the perpendicular direction to the layer surface. In order to obtain such orientation of the inorganic layered compound particles, it is important that the inorganic layered compound particles be compact upon forming a film shape through lamination by coating a support with a diluted homogeneous dispersion comprising the inorganic layered compound and the water-soluble polymer, and by evaporating slowly the liquid dispersion medium. Suitable manufacturing conditions for the above process include a concentration of the inorganic layered compound in the inorganic layered compound dispersion ranging preferably from 0.3 to 10 wt %, more preferably from 0.5 to 1 wt %, while the drying conditions in a heat drying method include drying under temperature conditions of 30 to 90° C., more preferably of 30 to 50° C., for about 10 minutes to 3 hours, preferably for about 20 minutes to 1 hour, in a forced draft oven.

When the water-soluble polymer-composite inorganic layered compound film does not detach by itself from the support, a self-supporting film is obtained, preferably, by detaching easily the film through drying, for instance, under temperature conditions of about 80° C. to 200° C. One hour of drying is sufficient. Too low a temperature is problematic in that detachment becomes harder to achieve. When the temperature is excessively high, the water-soluble polymer degrades, thus giving rise to various problems such as film coloring, loss of mechanical strength, and impaired gas barrier properties.

The clay film itself of the present invention uses an inorganic layered compound as a main raw material (70 wt % upwards). A preferred constitution thereof includes, for instance, 70 wt % upwards of a synthetic inorganic layered compound having a layer thickness of about 1 nm, and a particle size of up to 1 µm, and up to 30 wt % of an additive of a natural or synthetic low molecular compound/polymer having a molecule size of up to several nm. The clay film is manufactured, for instance, by layering compactly layer-like crystals having a thickness of about 1 nm oriented to a same orientation. The obtained film has a thickness of 3 to 200 µm, preferably of 3 to 200 µm, a gas-barrier performance of an oxygen permeability of less than 0.1 cc/m$^2$·24 hr·atm for a thickness of 25 µm; a visible light transmissivity of 80% or more (wavelength 500 nm), a visible light transmissivity of 80% or more (wavelength 500 nm), and a transmissivity of 80% or more for a wavelength of 350 nm, after 1 hour of heating at 300° C. The film can be formed to a large surface area of 100×40 cm or more, has high heat resistance, and exhibits no impaired gas barrier properties even after 1 hour of thermal treatment at 300° C. The linear expansion coefficient of the film is −2 ppm K$^{-1}$ from −100 to 100° C., and 0 ppm K$^{-1}$ from 100 to 200° C. The tensile strength of the film is 23.6 MPa. The tear strength of the film is 20.1 N/mm. The thermal diffusivity of the film is 2.7×10$^{-7}$ m$^2$/s. The oxygen index of the film in a combustion test is 94 or more.

Thus, the inorganic layered compound film of the present invention, in which a laminate of the inorganic layered compound particles is highly oriented, can be used as a self-supporting film, has excellent flexibility, is devoid of pinholes, and maintains its barrier properties against gases and liquids even at high temperatures ranging from 200° C. to 300° C. Also, the inorganic layered compound film of the present invention can be easily cut to an arbitrary shape or size, for instance a circular, square or rectangular shape, using scissors, a cutter or the like.

Accordingly, the inorganic layered compound film of the present invention can be used in a wide range of applications as a self-supporting film having excellent flexibility and excellent gas barrier properties, for instance, as a pliable display material, packaging material, electronic device encapsulating material or the like that is chemically stable and preserves its transparency even at a high temperature exceeding 200° C. The water-soluble polymer, which is a polar polymer, interacts with the inorganic layered compound, also polar itself, to form a thin film having excellent flexibility, strength and transparency. This prevents as a result the inorganic layered compound thin film from breaking easily through stretching, shaking and the like. The inorganic layered compound film has thus excellent characteristics that enable it to be used as a self-supporting film. The inorganic layered compound film of the present invention can be used, for instance, as an LCD substrate film, an organic EL substrate film, an electronic paper substrate film, an electronic device encapsulating film, a lens film, a light guide plate film, a prism film, a phase difference plate/polarizing plate film, a view-angle correction film, a PDP film, an LED film, an optical communication member, a transparent film for touch panels, a substrate film for various functional films, an electronic device film having a see-through internal structure, a film for optical recording media such as videodisk, CD/CD-R/CD-RW/DVD/MO/MD, a phase-change disk, an optical card and the like, or as a fuel cell sealing film, a solar battery film or the like.

Multi-layering is an example in which the above inorganic layered compound film is bonded to another member. That is, an inorganic layered compound composite film can be used made into a multilayer film together with a film B manufactured out of other materials, with a view to enhancing gas barrier performance and mechanical strength. An example thereof is a multilayer film obtained by bonding an inorganic layered compound composite film with a fluororesin film, which is a kind of plastic film, using an adhesive agent. Fluororesin films have low moisture permeability, and hence a multilayer film of a fluororesin film and an inorganic layered compound composite film can be used as a film having high moisture-blocking properties and high gas barrier properties. The material of the film B is no particularly limited provided that the multilayer film thereof and a clay film has good moldability, and may be, preferably, for instance a metal foil, thin-sheet glass, various plastic films, paper and the like. Herein there may be used also a multilayer film having three or more layers comprising an inorganic layered compound composite film.

Thin-sheet glass is a transparent heat-resistant film, but at most, its thinness is limited to about 0.4 mm. By contrast, the present inorganic layered compound composite film can be manufactured to be very thin, from about 0.2 mm to about 3 μm, contributing thus to making the device as a whole flexible as well as lightweight.

Film flexibility is an important characteristic in a flexible device material or an electronic device encapsulating material. The present layered compound composite film does not crack even when bent to a radius of 6 mm, and can be used thus in a wide range of flexible devices.

The film of the present invention has excellent flexibility and processability, and hence can arguably be used also in a roll-to-roll process.

The film of the present invention exhibits slight UV absorption (FIG. 2) and has thus apparently high light fastness that suppresses coloring over time.

The film of the present invention is bonded easily with other materials, allows ordinary adhesive agents to be used, and also allows surface coating, while water-vapor barrier properties and moisture resistance can be enhanced through surface coating and laminating.

The present invention exhibits the effects that allows (1) providing a transparent inorganic layered compound film in which inorganic layered compound particles are evenly oriented, and (2) using the inorganic layered compound film as a self-supporting film, for instance as a pliable display material, packaging material, electronic device encapsulating material or the like being chemically stable and retaining its transparency even at a high temperature exceeding 200° C.

BEST MODE FOR CARRYING OUT THE INVENTION

The present invention is explained below based on examples. However, the invention is in no way meant to be limited to or by such examples.

Example 1

(1) Manufacture of an Inorganic Layered Compound Thin Film

Synthetic saponite "Smecton" (Kunimine Industries, Inc.), as a clay, was added in an amount of 0.9 g to 100 $cm^3$ of distilled water, then the whole was placed, together with a Teflon™ rotor, in a plastic sealed container, followed by vigorous shaking for 2 hours at 25° C. to yield a homogeneous dispersion. To this dispersion there was added, as an additive, 0.1 g of commercially available sodium carboxymethylcellulose, followed by vigorous shaking, to yield a homogeneous dispersion comprising the synthetic saponite and the sodium carboxymethylcellulose. Next, this clay paste was deaerated in a vacuum defoaming apparatus. The clay paste was then applied onto a polypropylene tray having a flat surface. A ground spatula made of stainless steel was used to apply the clay paste. Using a spacer as a guide there was molded a clay paste film having a homogeneous thickness. The tray was placed in a forced draft oven and was dried for 1 hour under temperature conditions of 60° C., to yield a homogeneous additive-composite clay thin film having a thickness of about 10 μm. The formed clay film was detached from the tray, to yield a highly transparent, self-supporting film (TPSACMC 10-10) having excellent flexibility.

(2) Characteristics of the Inorganic Layered Compound Thin Film

TPSACMC 10-10 did not crack or exhibit any defects, even when bent to a 6-mm radius. The transmissivity of the film at a wavelength of 500 nm was of 81.7%, as measured using a visible-ultraviolet spectrophotometer. The total transmissivity of the film was of 91.5%, and the haze 14.2%, based on JIS K7105:1981 "Test Methods for Optical Characteristics of Plastics". The oxygen permeability coefficient of the film was measured using a Gasperm-100 device, from Jasco Corp. As a result there was obtained an oxygen gas permeability coefficient of 0.148 cc/m²·24 hr·atm at room temperature, which indicated gas barrier performance.

(3) Structure of the Inorganic Layered Compound Thin Film

Figure 1:
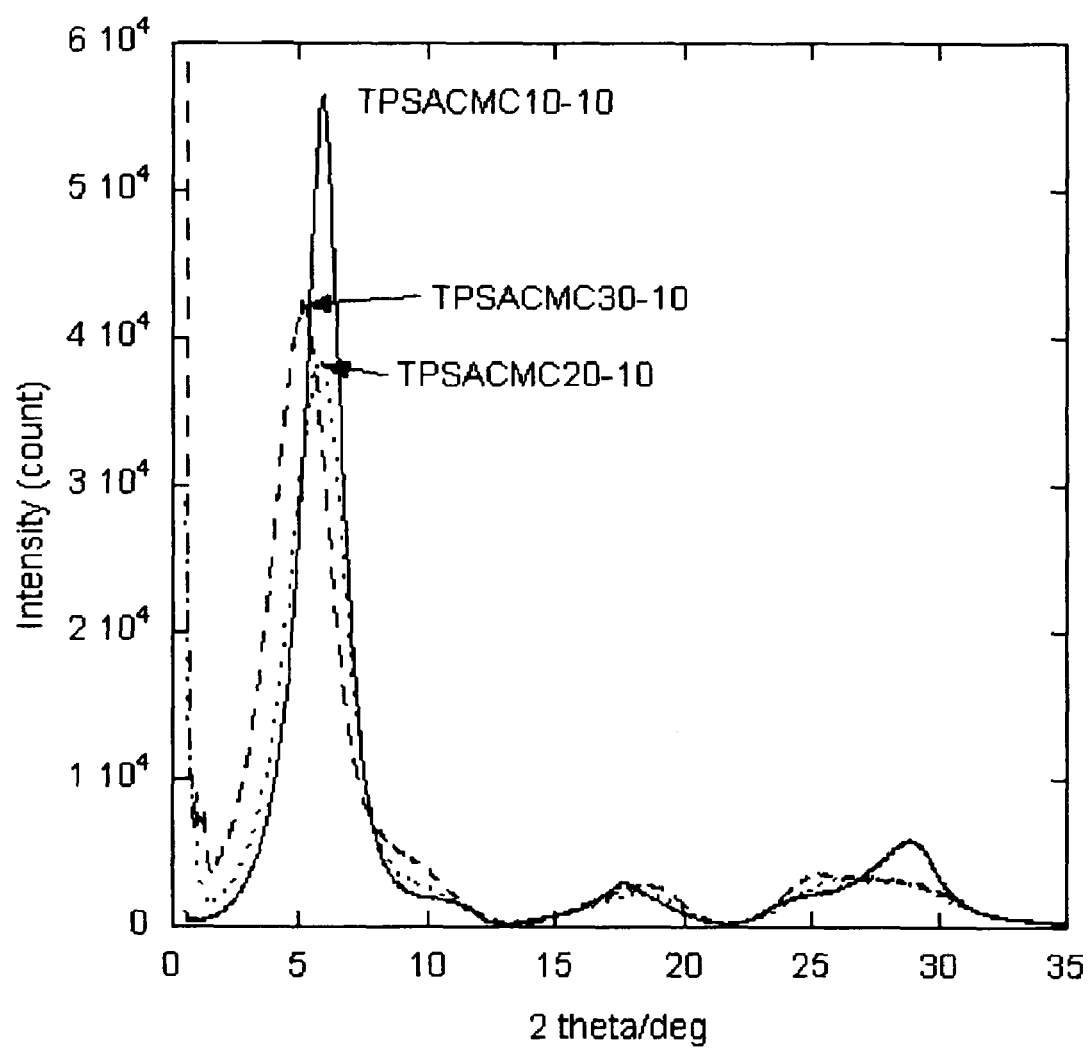
FIG. 1 is a diagram illustrating an X-ray diffraction chart of a composite inorganic layered compound thin film of the present invention prepared using sodium carboxymethylcellulose and synthetic smectite (in a weight ratio of 10% for TPSACMC 10-10, of 20% for TPSACMC 20-10, and of 30% for TPSACMC 30-10, relative to total solids of the used sodium carboxymethylcellulose)

FIG. 1 illustrates an X-ray diffraction chart of TPSACMC 10-10. In the X-ray diffraction chart, the base reflection peak 001 was observed at d=1.48 nm. This result showed that in TPSACMC 10-10 the clay layer-like crystals are stacked with orientation. A film having only smectite, without added sodium-carboxymethylcellulose, exhibited a base reflection peak 001 at d=1.24 nm. Compositing has thus the effect of widening the base spacing, and of yielding a nano-composite material in which sodium carboxymethylcellulose is intercalated between smectite layers. TPSACMC 10-10 was subjected to thermal analysis (temperature rise rate: 5° C./minute, under an air atmosphere). From the TG curve it was observed a weight reduction through elimination of adsorbed water, from room temperature to 200° C., and a further weight reduction from 272° C. to 450° C. arising from the thermal decomposition of the sodium carboxymethylcellulose. A differential thermal analysis (temperature rise rate: 5° C./minute) of the inorganic layered compound thin film showed a 6.7% weight reduction, on a dry solids basis, in a temperature range extending from 200° C. to 450° C.

(4) Heat Resistance of the Inorganic Layered Compound Thin Film

Figure 2:
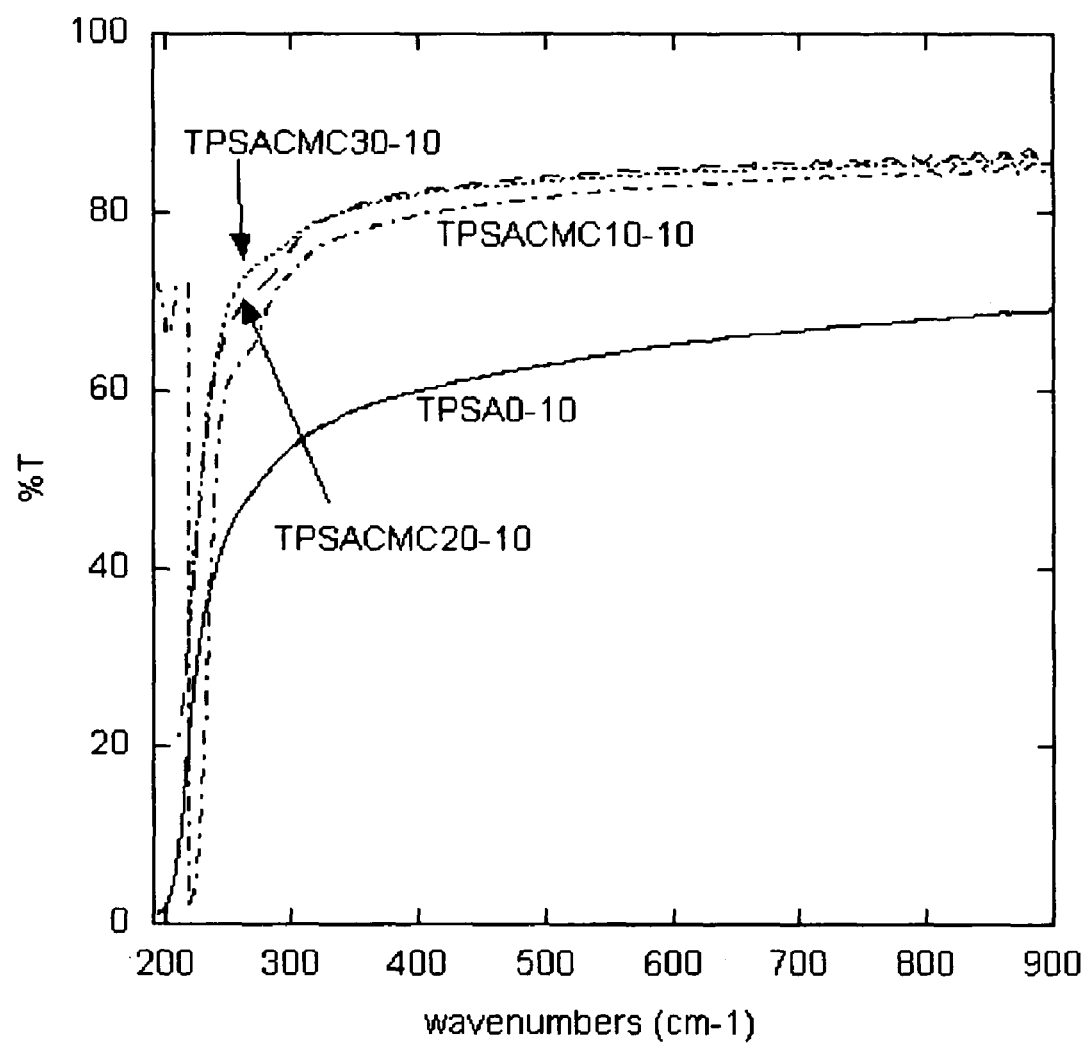
FIG. 2 is a diagram illustrating visible-ultraviolet absorption spectrum of a composite inorganic layered compound thin film of the present invention prepared using sodium carboxymethylcellulose and synthetic smectite (in a weight ratio of 10% for TPSACMC 10-10, of 20% for TPSACMC 20-10, and of 30% for TPSACMC 30-10, relative to total solids of the used sodium carboxymethylcellulose).

TPSACMC 10-10 was heated in an electric furnace. There TPSACMC 10-10 was heated from room temperature to 200° C. at a rate of 100° C. per hour. The temperature was then kept at 200° C. for 1 hour. Thereafter, TPSACMC 10-10 was left to cool in the electric oven. After the above thermal treatment, no anomalies such as a reduction in light transmissivity, occurrence of pinholes, cracks or the like or the like were observable to the naked eye. The transmissivity of the film at a wavelength of 500 nm was of 78.7%, as measured using a visible-ultraviolet spectrophotometer (FIG. 2).

Example 2

(1) Manufacture of an Inorganic Layered Compound Thin Film

Synthetic saponite "Smecton" (Kunimine Industries, Inc.), as a clay, was added in an amount of 0.8 g to 100 cm³ of distilled water, then the whole was placed, together with a Teflon™ rotor, in a plastic sealed container, followed by vigorous shaking for 2 hours at 25° C. to yield a homogeneous dispersion. To this dispersion there was added, as an additive, 0.2 g of commercially available sodium carboxymethylcellulose, followed by vigorous shaking, to yield a homogeneous dispersion comprising the synthetic saponite and the sodium carboxymethylcellulose. Next, this clay paste was deaerated in a vacuum defoaming apparatus. The clay paste was then applied onto a polypropylene tray having a flat surface. A ground spatula made of stainless steel was used to apply the clay paste. Using a spacer as a guide there was molded a clay paste film having a homogeneous thickness. The tray was placed in a forced draft oven and was dried for 1 hour under temperature conditions of 60° C., to yield a homogeneous additive-composite clay thin film having a thickness of about 10 μm. The formed clay film was detached from the tray, to yield a highly transparent, self-supporting film (TPSACMC 20-10) having excellent flexibility.

(2) Characteristics of the Inorganic Layered Compound Thin Film

TPSACMC 20-10 did not crack or exhibit any defects, even when bent to a 6-mm radius. The stiffness measured in a bending resistance test according to JIS1096:1999A was of 0.008 mN on the front face and 0.009 mN on the rear face. The transmissivity of the film at a wavelength of 500 nm was of 83.6%, as measured using a visible-ultraviolet spectrophotometer (FIG. 2).

(3) Structure of the Inorganic Layered Compound Thin Film

FIG. 1 illustrates an X-ray diffraction chart of TPSACMC 20-10. In the X-ray diffraction chart, the base reflection peak 001 was observed at d=1.51 nm. This result showed that in TPSACMC 20-10 the clay layer-like crystals are stacked with orientation. A film having only smectite, without added sodium-carboxymethylcellulose, exhibited a base reflection peak 001 at d=1.24 nm. Compositing has thus the effect of widening the base spacing, and of yielding a nano-composite material in which sodium carboxymethylcellulose is intercalated between smectite layers. TPSACMC 20-10 was subjected to thermal analysis (temperature rise rate: 5° C./minute, under an air atmosphere). From the TG curve it was observed a weight reduction through elimination of adsorbed water, from room temperature to 200° C., and a further weight reduction from 262° C. to 450° C. arising from the thermal decomposition of the sodium carboxymethylcellulose. A differential thermal analysis (temperature rise rate: 5° C./minute) of the inorganic layered compound thin film showed a 10.5% weight reduction, on a dry solids basis, in a temperature range extending from 200° C. to 450° C.

Example 3

(1) Manufacture of an Inorganic Layered Compound Thin Film

Synthetic saponite "Smecton" (Kunimine Industries, Inc.), as a clay, was added in an amount of 0.7 g to 100 cm³ of distilled water, then the whole was placed, together with a Teflon™ rotor, in a plastic sealed container, followed by vigorous shaking for 2 hours at 25° C. to yield a homogeneous dispersion. To this dispersion there was added, as an additive, 0.3 g of commercially available sodium carboxymethylcellulose, followed by vigorous shaking, to yield a homogeneous dispersion comprising the synthetic saponite and the sodium carboxymethylcellulose. Next, this clay paste was deaerated in a vacuum defoaming apparatus. The clay paste was then applied onto a polypropylene tray having a flat surface. A ground spatula made of stainless steel was used to apply the clay paste. Using a spacer as a guide there was molded a clay paste film having a homogeneous thickness. The tray was placed in a forced draft oven and was dried for 1 hour under temperature conditions of 60° C., to yield a homogeneous additive-composite clay thin film having a thickness of about 10 μm. The formed clay film was detached from the tray, to yield a highly transparent, self-supporting film (TPSACMC 30-10) having excellent flexibility.

(2) Characteristics of the Inorganic Layered Compound Thin Film

TPSACMC 30-10 did not crack or exhibit any defects, even when bent to a 6-mm radius. The transmissivity of the film at a wavelength of 500 nm was of 84.2%, as measured using a visible-ultraviolet spectrophotometer (FIG. 2). The total transmissivity of the film was of 92.5%, and the haze 10.1%, based on JIS K7105:1981 "Test Methods for Optical Characteristics of Plastics". The oxygen permeability coefficient of the film was measured using a Gasperm-100 device, from Jasco Corp. As a result there was obtained an oxygen gas permeability coefficient of 0.017 cc/m$^2$·24 hr·atm at room temperature, which indicated gas barrier performance.

(3) Structure of the Inorganic Layered Compound Thin Film

FIG. 1 illustrates an X-ray diffraction chart of TPSACMC 30-10. In the X-ray diffraction chart, the base reflection peak 001 was observed at d=1.72 nm. This result showed that in TPSACMC 30-10 the clay layer-like crystals are stacked with orientation. A film having only smectite, without added sodium-carboxymethylcellulose, exhibited a base reflection peak 001 at d=1.24 nm. Compositing has thus the effect of widening the base spacing, and of yielding a nano-composite material in which sodium carboxymethylcellulose is intercalated between smectite layers. TPSACMC 30-10 was subjected to thermal analysis (temperature rise rate: 5° C./minute, under an air atmosphere). From the TG curve it was observed a weight reduction through elimination of adsorbed water, from room temperature to 200° C., and a further weight reduction from 251° C. to 450° C. arising from the thermal decomposition of the sodium carboxymethylcellulose. A differential thermal analysis (temperature rise rate: 5° C./minute) of the inorganic layered compound thin film showed a 15.7% weight reduction, on a dry solids basis, in a temperature range extending from 200° C. to 450° C.

Example 4

(1) Manufacture of an Inorganic Layered Compound Thin Film

Synthetic saponite "Smecton" (Kunimine Industries, Inc.), as a clay, was added in an amount of 0.9 g to 100 cm$^3$ of distilled water, then the whole was placed, together with a Teflon™ rotor, in a plastic sealed container, followed by vigorous shaking for 2 hours at 25° C. to yield a homogeneous dispersion. To this dispersion there was added, as an additive, 0.1 g of commercially available polyvinyl acetate, followed by vigorous shaking, to yield a homogeneous dispersion comprising the synthetic saponite and the polyvinyl acetate. Next, this clay paste was deaerated in a vacuum defoaming apparatus. The clay paste was then applied onto a polypropylene tray having a flat surface. A ground spatula made of stainless steel was used to apply the clay paste. Using a spacer as a guide there was molded a clay paste film having a homogeneous thickness. The tray was placed in a forced draft oven and was dried for 1 hour under temperature conditions of 60° C., to yield a homogeneous additive-composite clay thin film having a thickness of about 10 µm. The formed clay film was detached from the tray, to yield a highly transparent, self-supporting film having excellent flexibility.

Comparative Example 1

(1) Manufacture of an Inorganic Layered Compound Thin Film

Synthetic saponite "Smecton" (Kunimine Industries, Inc.), as a clay, was added in an amount of 1.0 g to 100 cm$^3$ of distilled water, then the whole was placed, together with a Teflon™ rotor, in a plastic sealed container, followed by vigorous shaking for 2 hours at 25° C. to yield a homogeneous dispersion. Next, this clay paste was deaerated in a vacuum defoaming apparatus. The clay paste was then applied onto a polypropylene tray having a flat surface. A ground spatula made of stainless steel was used to apply the clay paste. Using a spacer as a guide there was molded a clay paste film having a homogeneous thickness. The tray was placed in a forced draft oven and was dried for 1 hour under temperature conditions of 60° C., to yield a homogeneous additive-composite clay thin film having a thickness of about 10 µm. The formed clay film was detached from the tray, to yield a highly transparent, self-supporting film (TPSA 0-10) having excellent flexibility.

(2) Characteristics of the Inorganic Layered Compound Thin Film

TPSA 0-10 exhibited cracks when bent to a 6-mm radius. The transmissivity of the film at a wavelength of 500 nm was of 62.8%, as measured using a visible-ultraviolet spectrophotometer. Thus, high pliability and light transmissivity could not be achieved when no organic additive was added.

Example 5

(1) Manufacture of an Inorganic Layered Compound Thin Film

Natural smectite "Kunipia P" (Kunimine Industries, Inc.), as a clay, was added in an amount of 0.9 g to 100 cm$^3$ of distilled water, then the whole was placed, together with a Teflon™ rotor, in a plastic sealed container, followed by vigorous shaking for 2 hours at 25° C. to yield a homogeneous dispersion. To this dispersion there was added, as an additive, 0.1 g of commercially available epsilon caprolactam, followed by vigorous shaking, to yield a homogeneous dispersion comprising the natural smectite and the epsilon caprolactam. Next, this clay paste was deaerated in a vacuum defoaming apparatus. The clay paste was then applied onto a brass plate. A ground spatula made of stainless steel was used to apply the clay paste. Using a spacer as a guide there was molded a clay paste film having a homogeneous thickness. The tray was placed in a forced draft oven and was dried for 1 hour under temperature conditions of 60° C., to yield a homogeneous additive-composite clay thin film having a thickness of about 10 µm. The formed clay film was detached from the tray, to yield a self-supporting film having excellent flexibility. The transmissivity of the film at a wavelength of 500 nm was of 13.1%, as measured using a visible-ultraviolet spectrophotometer.

(2) Characteristics of the Inorganic Layered Compound Thin Film

The film did not crack or exhibit any defects, even when bent to a 6-mm radius. The total transmissivity of the film was of 86.9%, and the haze 78.2%, based on JIS K7105:1981 "Test Methods for Optical Characteristics of Plastics".

Example 6

(1) Manufacture of an Inorganic Layered Compound Thin Film

Natural smectite "Kunipia P" (Kunimine Industries, Inc.), as a clay, was added in an amount of 0.91 parts to distilled water, then the whole was placed, together with a Teflon™ rotor, in a plastic sealed container, followed by vigorous shaking for 2 hours at 25° C. to yield a homogeneous dispersion. To this dispersion there was added, as an additive, 0.09 parts of commercially available epsilon caprolactam, followed by vigorous shaking, to yield a homogeneous dispersion comprising the natural smectite and the epsilon caprolactam. Next, this clay paste was deaerated in a vacuum defoaming apparatus. The clay paste was then applied onto a brass plate. A ground spatula made of stainless steel was used to apply the clay paste. Using a spacer as a guide there was molded a clay paste film having a homogeneous thickness. The tray was placed in a forced draft oven and was dried for 1 hour under temperature conditions of 60° C., to yield a homogeneous additive-composite clay thin film having a thickness of about 80 μm. The formed clay film was detached from the tray, to yield a self-supporting film having excellent flexibility.

(2) Characteristics of the Inorganic Layered Compound Thin Film

The film did not crack or exhibit any defects, even when bent to a 6-mm radius. The linear expansion coefficient of the film was 10 ppm $K^{-1}$ in a temperature range extending from −100° C. to 100° C., and of −6 ppm $K^{-1}$ in a temperature range extending from 100° C. to 200° C. The oxygen permeability coefficient of the film was measured using a Gasperm-100 device, from Jasco Corp. As a result there was obtained an oxygen gas permeability coefficient of less than $3.2 \times 10^{-11}$ $cm^2 \ s^{-1} \ cm \ Hg^{-1}$ at room temperature, which indicated gas barrier performance. Even after heating at 300° C. for 24 hours, the oxygen gas permeability coefficient of the film was still of less than $3.2 \times 10^{-11} \ cm^2 \ s^{-1} \ cm \ Hg^{-1}$ at room temperature, which indicated gas barrier performance even after a high-temperature treatment.

Comparative Example 2

(1) Manufacture of an Inorganic Layered Compound Thin Film

Synthetic saponite "Smecton" (Kunimine Industries, Inc.), as a clay, was added in an amount of 0.95 g to 100 $cm^3$ of distilled water, then the whole was placed, together with a Teflon™ rotor, in a plastic sealed container, followed by vigorous shaking for 2 hours at 25° C. to yield a homogeneous dispersion. To this dispersion there was added, as an additive, 0.05 g of commercially available sodium polyacrylate, followed by vigorous shaking, to yield a homogeneous dispersion comprising the synthetic saponite and the sodium polyacrylate. Next, this clay paste was deaerated in a vacuum defoaming apparatus. The clay paste was then made to flow into a container having the bottom face thereof lined with a fluororesin sheet, to mold a clay paste film having a homogeneous thickness. The tray was placed in a forced draft oven and was dried for 24 hours under temperature conditions of 60° C., to yield a homogeneous additive-composite clay thin film having a thickness of about 100 μm. The formed clay film was detached from the fluororesin sheet, to yield a self-supporting film having excellent flexibility.

(2) Characteristics of the Inorganic Layered Compound Thin Film

The film did not crack when bent to a radius of 20 mm, but did when bent to a radius of 6 mm. The transmissivity of the film at a wavelength of 500 nm was of 86.6%, as measured using a visible-ultraviolet spectrophotometer. A differential thermal analysis (temperature rise rate: 5° C./minute, under an air atmosphere) of the film evidenced a weight reduction through elimination of adsorbed water, from room temperature to 120° C., as well as a thermal decomposition temperature of 466° C. for the sodium polyacrylate in the clay thin film. The differential thermal analysis showed also a 4.9% weight reduction, on a dry solids basis, in a temperature range extending from 200° C. to 550° C. The average surface roughness on the side facing the atmosphere was of 14.3 nm during drying, as measured with an atomic force microscope over a measurement range of 1 square μm.

Example 7

(1) Manufacture of an Inorganic Layered Compound Thin Film

Synthetic saponite "Smecton" (Kunimine Industries, Inc.), as a clay, was added in an amount of 0.9 g to 100 $cm^3$ of distilled water, then the whole was placed, together with a Teflon™ rotor, in a plastic sealed container, followed by vigorous shaking for 2 hours at 25° C. to yield a homogeneous dispersion. To this dispersion there was added, as an additive, 0.1 g of commercially available sodium polyacrylate, followed by vigorous shaking, to yield a homogeneous dispersion comprising the synthetic saponite and the sodium polyacrylate. Next, this clay paste was deaerated in a vacuum defoaming apparatus. The clay paste was then made to flow into a container having the bottom face thereof lined with a fluororesin sheet, to mold a clay paste film having a homogeneous thickness. The tray was placed in a forced draft oven and was dried for 24 hours under temperature conditions of 60° C., to yield a homogeneous additive-composite clay thin film having a thickness of about 100 μm. The formed clay film was detached from the fluororesin sheet, to yield a self-supporting film having excellent flexibility.

(2) Characteristics of the Inorganic Layered Compound Thin Film

The film did not crack or exhibit any defects, even when bent to a 2-mm radius. The transmissivity of the film at a wavelength of 500 nm was of 90.3%, as measured using a visible-ultraviolet spectrophotometer. A differential thermal analysis (temperature rise rate: 5° C./minute, under an air atmosphere) of the film evidenced a weight reduction through elimination of adsorbed water, from room temperature to 120° C., as well as a thermal decomposition temperature of 466° C. for the sodium polyacrylate in the clay thin film. The differential thermal analysis showed also a 8.2% weight reduction, on a dry solids basis, in a temperature range extending from 200° C. to 550° C. The average surface roughness on the side facing the atmosphere was of 4.4 nm during drying, as measured with an atomic force microscope over a measurement range of 1 square μm.

Example 8

(1) Manufacture of an Inorganic Layered Compound Thin Film

Synthetic saponite "Smecton" (Kunimine Industries, Inc.), as a clay, was added in an amount of 0.85 g to 100 $cm^3$ of distilled water, then the whole was placed, together with a Teflon™ rotor, in a plastic sealed container, followed by vigorous shaking for 2 hours at 25° C. to yield a homogeneous dispersion. To this dispersion there was added, as an additive, 0.15 g of commercially available sodium polyacrylate, followed by vigorous shaking, to yield a homogeneous dispersion comprising the synthetic saponite and the sodium polyacrylate. Next, this clay paste was deaerated in a vacuum defoaming apparatus. The clay paste was then made to flow into a container having the bottom face thereof lined with a fluororesin sheet, to mold a clay paste film having a homogeneous thickness. The tray was placed in a forced draft oven and was dried for 24 hours under temperature conditions of 60° C., to yield a homogeneous additive-composite clay thin film having a thickness of about 100 μm. The formed clay film was detached from the fluororesin sheet, to yield a self-supporting film having excellent flexibility.

(2) Characteristics of the Inorganic Layered Compound Thin Film

The film did not crack or exhibit any defects, even when bent to a 2-mm radius. The transmissivity of the film at a wavelength of 500 nm was of 90.7%, as measured using a visible-ultraviolet spectrophotometer. A differential thermal analysis (temperature rise rate: 5° C./minute, under an air atmosphere) of the film evidenced a weight reduction through elimination of adsorbed water, from room temperature to 120° C., as well as a thermal decomposition temperature of 466° C. for the sodium polyacrylate in the clay thin film. The differential thermal analysis showed also a 9.8% weight reduction, on a dry solids basis, in a temperature range extending from 200° C. to 550° C. The average surface roughness on the side facing the atmosphere was of 6.5 nm during drying, as measured with an atomic force microscope over a measurement range of 1 square μm.

Example 9

(1) Manufacture of an Inorganic Layered Compound Thin Film

Synthetic saponite "Smecton" (Kunimine Industries, Inc.), as a clay, was added in an amount of 0.8 g to 100 cm³ of distilled water, then the whole was placed, together with a Teflon™ rotor, in a plastic sealed container, followed by vigorous shaking for 2 hours at 25° C. to yield a homogeneous dispersion. To this dispersion there was added, as an additive, 0.2 g of commercially available sodium polyacrylate, followed by vigorous shaking, to yield a homogeneous dispersion comprising the synthetic saponite and the sodium polyacrylate. Next, this clay paste was deaerated in a vacuum defoaming apparatus. The clay paste was then made to flow into a container having the bottom face thereof lined with a fluororesin sheet, to mold a clay paste film having a homogeneous thickness. The tray was placed in a forced draft oven and was dried for 24 hours under temperature conditions of 60° C., to yield a homogeneous additive-composite clay thin film having a thickness of about 100 μm. The formed clay film was detached from the fluororesin sheet, to yield a self-supporting film having excellent flexibility.

(2) Characteristics of the Inorganic Layered Compound Thin Film

The film did not crack or exhibit any defects, even when bent to a 2-mm radius. The transmissivity of the film at a wavelength of 500 nm was of 89.4%, as measured using a visible-ultraviolet spectrophotometer. A differential thermal analysis (temperature rise rate: 5° C./minute, under an air atmosphere) of the film evidenced a weight reduction through elimination of adsorbed water, from room temperature to 120° C., as well as a thermal decomposition temperature of 465° C. for the sodium polyacrylate in the clay thin film. The differential thermal analysis showed also a 14.1% weight reduction, on a dry solids basis, in a temperature range extending from 200° C. to 550° C. The average surface roughness on the side facing the atmosphere was of 7.5 nm during drying, as measured with an atomic force microscope over a measurement range of 1 square μm.

Example 10

(1) Manufacture of an Inorganic Layered Compound Thin Film

Synthetic saponite "Smecton" (Kunimine Industries, Inc.), as a clay, was added in an amount of 0.75 g to 100 cm³ of distilled water, then the whole was placed, together with a Teflon™ rotor, in a plastic sealed container, followed by vigorous shaking for 2 hours at 25° C. to yield a homogeneous dispersion. To this dispersion there was added, as an additive, 0.25 g of commercially available sodium polyacrylate, followed by vigorous shaking, to yield a homogeneous dispersion comprising the synthetic saponite and the sodium polyacrylate. Next, this clay paste was deaerated in a vacuum defoaming apparatus. The clay paste was then made to flow into a container having the bottom face thereof lined with a fluororesin sheet, to mold a clay paste film having a homogeneous thickness. The tray was placed in a forced draft oven and was dried for 24 hours under temperature conditions of 60° C., to yield a homogeneous additive-composite clay thin film having a thickness of about 100 μm. The formed clay film was detached from the fluororesin sheet, to yield a self-supporting film having excellent flexibility.

(2) Characteristics of the Inorganic Layered Compound Thin Film

The film did not crack or exhibit any defects, even when bent to a 2-mm radius. The transmissivity of the film at a wavelength of 500 nm was of 88.2%, as measured using a visible-ultraviolet spectrophotometer. A differential thermal analysis (temperature rise rate: 5° C./minute, under an air atmosphere) of the film evidenced a weight reduction through elimination of adsorbed water, from room temperature to 120° C., as well as a thermal decomposition temperature of 464° C. for the sodium polyacrylate in the clay thin film. The differential thermal analysis showed also a 16.3% weight reduction, on a dry solids basis, in a temperature range extending from 200° C. to 550° C. The average surface roughness on the side facing the atmosphere was of 12.8 nm during drying, as measured with an atomic force microscope over a measurement range of 1 square μm.

Example 11

(1) Manufacture of an Inorganic Layered Compound Thin Film

Synthetic saponite "Smecton" (Kunimine Industries, Inc.), as a clay, was added in an amount of 0.7 g to 100 cm³ of distilled water, then the whole was placed, together with a Teflon™ rotor, in a plastic sealed container, followed by vigorous shaking for 2 hours at 25° C. to yield a homogeneous dispersion. To this dispersion there was added, as an additive, 0.3 g of commercially available sodium polyacrylate, followed by vigorous shaking, to yield a homogeneous dispersion comprising the synthetic saponite and the sodium polyacrylate. Next, this clay paste was deaerated in a vacuum defoaming apparatus. The clay paste was the applied onto a fluororesin sheet. Using a spacer as a guide there was molded a clay paste film having a homogeneous thickness. The tray was placed in a forced draft oven and was dried for 24 hours under temperature conditions of 60° C., to yield a homogeneous additive-composite clay thin film having a thickness of about 100 µm. The formed clay film was detached from the fluororesin sheet, to yield a self-supporting film having excellent flexibility.

(2) Characteristics of the Inorganic Layered Compound Thin Film

The film did not crack or exhibit any defects, even when bent to a 2-mm radius. The transmissivity of the film at a wavelength of 500 nm was of 86.6%, as measured using a visible-ultraviolet spectrophotometer. A differential thermal analysis (temperature rise rate: 5° C./minute, under an air atmosphere) of the film evidenced a weight reduction through elimination of adsorbed water, from room temperature to 120° C., as well as a thermal decomposition temperature of 460° C. for the sodium polyacrylate in the clay thin film. The differential thermal analysis showed also a 21.3% weight reduction, on a dry solids basis, in a temperature range extending from 200° C. to 550° C. The differential thermal analysis showed also a 9.5% weight reduction, on a dry solids basis, in a temperature range extending from 200° C. to 450° C. The average surface roughness on the side facing the atmosphere was of 16.1 nm during drying, as measured with an atomic force microscope over a measurement range of 1 square µm.

Comparative Example 3

(1) Manufacture of an Inorganic Layered Compound Thin Film

Synthetic saponite "Smecton" (Kunimine Industries, Inc.), as a clay, was added in an amount of 0.8 g to 100 cm$^3$ of distilled water, then the whole was placed, together with a Teflon™ rotor, in a plastic sealed container, followed by vigorous shaking for 2 hours at 25° C. to yield a homogeneous dispersion. To this dispersion there were added, as additives, 0.2 g of commercially available sodium carboxymethylcellulose, followed by vigorous shaking, to yield a homogeneous dispersion comprising the synthetic saponite and the sodium carboxymethylcellulose. Next, this clay paste was deaerated in a vacuum defoaming apparatus. The clay paste was the applied onto the surface of a coarse substrate made of fluororesin. A ground spatula made of stainless steel was used to apply the clay paste. Using a spacer as a guide there was molded a clay paste film having a homogeneous thickness. The tray was placed in a forced draft oven and was dried for 1 hours under temperature conditions of 60° C., to yield a homogeneous additive-composite clay thin film having a thickness of about 10 µm. The formed clay film was detached from the tray, to yield a self-supporting film having excellent flexibility.

(2) Characteristics of the Inorganic Layered Compound Thin Film

The transmissivity of the film at a wavelength of 500 nm was of 68.1%, as measured using a visible-ultraviolet spectrophotometer. Thus, when the substrate surface is not flat, the film surface becomes rougher, giving rise to surface scattering of light and impairing light transmittance.

Example 12

(1) Manufacture of an Inorganic Layered Compound Thin Film

Synthetic saponite "Smecton" (Kunimine Industries, Inc.), as a clay, was added in an amount of 0.8 g to 100 cm$^3$ of distilled water, then the whole was placed, together with a Teflon™ rotor, in a plastic sealed container, followed by vigorous shaking for 2 hours at 25° C. to yield a homogeneous dispersion. To this dispersion there was added, as an additive, 0.2 g of commercially available sodium polyacrylate, followed by vigorous shaking, to yield a homogeneous dispersion comprising the synthetic saponite and the sodium polyacrylate. Next, this clay paste was deaerated in a vacuum defoaming apparatus. The clay paste was then made to flow into a container having the bottom face thereof lined with a fluororesin sheet, to mold a clay paste film having a homogeneous thickness. This tray was placed in a forced draft oven and was dried for 24 hours under temperature conditions of 60° C., to yield a homogeneous additive-composite clay thin film having a thickness of about 10 µm. The formed clay film was detached from the fluororesin sheet, to yield a self-supporting film having excellent flexibility.

(2) Characteristics of the Inorganic Layered Compound Thin Film

The transmissivity of the film at a wavelength of 500 nm was of 90.3%. Further, the transmissivity of the film at a wavelength of 500 nm was of 89.3% after 1 hour of thermal treatment at 300° C.

Example 13

(1) Manufacture of an Inorganic Layered Compound Thin Film

Synthetic saponite "Smecton" (Kunimine Industries, Inc.), as a clay, was added in an amount of 0.8 g to 100 cm$^3$ of distilled water, then the whole was placed, together with a Teflon™ rotor, in a plastic sealed container, followed by vigorous shaking for 2 hours at 25° C. to yield a homogeneous dispersion. To this dispersion there was added, as an additive, 0.2 g of commercially available sodium polyacrylate, followed by vigorous shaking, to yield a homogeneous dispersion comprising the synthetic saponite and the sodium polyacrylate. Next, this clay paste was deaerated in a vacuum defoaming apparatus. The clay paste was then made to flow into a container having the bottom face thereof lined with a fluororesin sheet, to mold a clay paste film having a thickness of about 5 mm. This tray was placed in a forced draft oven and was dried for 48 hours under temperature conditions of 60° C., to yield a homogeneous additive-composite clay thin film having a thickness of about 200 µm. The formed clay film was detached from the fluororesin sheet, to yield a self-supporting film having excellent flexibility.

(2) Manufacture of an Inorganic Layered Compound Thin Film

Synthetic saponite "Smecton" (Kunimine Industries, Inc.), as a clay, was added in an amount of 0.8 g to 100 cm$^3$ of distilled water, then the whole was placed, together with a Teflon™ rotor, in a plastic sealed container, followed by vigorous shaking for 2 hours at 25° C. to yield a homogeneous dispersion. To this dispersion there was added, as an additive, 0.2 g of commercially available sodium polyacrylate, followed by vigorous shaking, to yield a homogeneous dispersion comprising the synthetic saponite and the sodium polyacrylate. Next, this clay paste was deaerated in a vacuum defoaming apparatus. The clay paste was then made to flow into a container having the bottom face thereof lined with a fluororesin sheet, to mold a clay paste film having a homogeneous thickness. The tray was placed in a forced draft oven and was dried for 24 hours under temperature conditions of 60° C., to yield a homogeneous additive-composite clay thin film having a thickness of about 10 µm. The formed clay film was detached from the fluororesin sheet, to yield a self-supporting film having excellent flexibility.

(3) Characteristics of the Inorganic Layered Compound Thin Film

The linear thermal expansion coefficient of the film was of −1 ppm at from −100° C. to +200° C.

INDUSTRIAL APPLICABILITY

As described above, the present invention relates to a transparent material characterized by being a film having an inorganic layered compound as a main constituent thereof, wherein the transparent material has mechanical strength so as to allow it to be used as a self-supporting film, with a more highly oriented layering of inorganic layered compound particles. The inorganic layered compound film of the present invention is thus a compact material that can be used as a self-supporting film, having excellent flexibility, being devoid of pinholes, and retaining its barrier properties even at a high temperature exceeding 200° C. Accordingly, the inorganic layered compound film of the present invention, which is a member that withstands high-temperature conditions during production or processing, can be used in a wide range of applications as a transparent film having excellent flexibility. The inorganic layered compound film of the present invention can be widely used as a transparent film having excellent flexibility under high-temperature conditions. The inorganic layered compound film of the present invention can be widely used as a transparent film where high gas barrier properties are required. Accordingly, the inorganic layered compound film of the present invention can be used in many manufactured articles. Examples of such articles include, for instance, an LCD substrate film, an organic EL substrate film, an electronic paper substrate film, an electronic device encapsulating film, a lens film, a light guide plate film, a prism film, a phase difference plate/polarizing plate film, a view-angle correction film, a PDP film, an LED film, an optical communication member, a transparent film for touch panels, a substrate film for various functional films, an electronic device film having a see-through internal structure, a film for optical recording media such as videodisk, CD/CD-R/CD-RW/DVD/MO/MD, a phase-change disk, an optical card and the like, or as a fuel cell sealing film, a solar battery film or the like.

The invention claimed is:

1. A transparent material as a film: comprising (1) a synthetic layered clay and a water-soluble resin; (2) the weight ratio of the layered clay being not less than 70% relative to total solids; the film has (3) a total light transmissivity exceeding 80% as determined by JIS k7105: 1981; (4) gas barrier properties; and (5) mechanical strength so as to allow it to be used as a self-supporting film, wherein the water-soluble resin is one or more selected from the group consisting of dextrin, starch, a cellulose resin, gelatin, polylactic acid, an alkyd resin, a polyurethane resin, a epoxy resin, fluororesins, an acrylic resin, a methacrylic resin, a phenolic resin, a polyamide resin, a polyester resin, a polyimide resin, a polyvinyl resin, polycarbonate, polyethylene glycol, polyacrylamide, polyethylene oxide, a protein, deoxyribonucleic acid, ribonucleic acid, a polyamino acid, a benzoic acid compound, and an acrylic acid resin, wherein the weight proportion of the water-soluble resin relative to total solids is less than 30%, wherein the light transmissivity of the film at 500 nm is not less than 75%, as measured by an ultraviolet-visible spectroscope, after heating at 200° C. for 1 hour under normal air conditions, and wherein the average surface roughness of the film is not greater than 20 nm, as measured by an atomic force microscope.

2. The transparent material according to claim 1, wherein light transmittance, gas barrier properties or mechanical strength are improved by forming new chemical bonds within molecules of an additive, between molecules of the additive, between the additive and the layered inorganic compound and between layered inorganic compound crystals, through a chemical addition reaction, a condensation reaction or a polymerization reaction.

3. The transparent material according to claim 1, wherein the thickness of the film is not greater than 0.2 mm.

4. The transparent material according to claim 1, wherein the light transmissivity of the film at 500 nm is not less than 80%, as measured by an ultraviolet-visible spectroscope.

5. The transparent material according to claim 1, wherein in a differential thermal analysis, weight reduction of the film in a temperature range from 200° C. to 450° C. is less than 20% on a dry solids basis, and there is no change in the basic structure of the layered inorganic compound constituting the transparent material.

6. The transparent material according to claim 1, wherein the permeability coefficient of the film to oxygen gas is less than $3.2 \times 10^{-11}$ $cm^2$ $s^{-1}$ cm $Hg^{-1}$ at room temperature.

7. The transparent material according to claim 1, wherein the permeability coefficient of the film to oxygen gas is less than $3.2 \times 10^{-11}$ $cm^2$ $s^{-1}$ cm $Hg^{-1}$ at room temperature after a thermal treatment at 300° C. for 1 hour.

8. The transparent material according claim 1, wherein the film can be used without cracking even at a bending radius of 6 mm.

9. The transparent material according to claim 1, wherein the linear thermal expansion coefficient of the film is −10 to 10 ppm at from −100° C. to +200° C.

10. The transparent material according to claim 1, wherein the transparent material is a sealing material, a packaging material, a protective material, a flexible substrate or a display material.

* * * * *